(12) United States Patent
Labanc et al.

(10) Patent No.: US 10,469,038 B2
(45) Date of Patent: Nov. 5, 2019

(54) BROADBAND MATCHING NETWORK

(71) Applicants: Anton Labanc, Ehrenkirchen (DE);
Daniel Gruner, Müllheim (DE);
Markus Reiff, Eschweiler (DE)

(72) Inventors: Anton Labanc, Ehrenkirchen (DE);
Daniel Gruner, Müllheim (DE);
Markus Reiff, Eschweiler (DE)

(73) Assignee: COMET AG (CH)

( * ) Notice: Subject to any disclaimer, the term of this patent is extended or adjusted under 35 U.S.C. 154(b) by 350 days.

(21) Appl. No.: 15/659,047

(22) Filed: Jul. 25, 2017

(65) Prior Publication Data

US 2018/0026589 A1   Jan. 25, 2018

(30) Foreign Application Priority Data

Jul. 25, 2016   (EP) .................................. 16181040

(51) Int. Cl.
*H03F 1/56* (2006.01)
*H03F 3/19* (2006.01)
*H03F 3/21* (2006.01)

(52) U.S. Cl.
CPC .............. *H03F 1/565* (2013.01); *H03F 3/19* (2013.01); *H03F 3/21* (2013.01); *H03F 2200/387* (2013.01); *H03F 2200/451* (2013.01)

(58) Field of Classification Search
CPC ...................................................... H03F 1/565
See application file for complete search history.

(56) References Cited

U.S. PATENT DOCUMENTS

| | | | | |
|---|---|---|---|---|
| 3,454,895 A | * | 7/1969 | Hall | ........................ H03F 1/48 330/305 |
| 4,644,505 A | | 2/1987 | Spychalski | |
| 7,319,763 B2 | * | 1/2008 | Bank | ...................... H03F 3/181 330/10 |

(Continued)

FOREIGN PATENT DOCUMENTS

CN   101 951 232 A   1/2011

OTHER PUBLICATIONS

Extended European Search Report for Application No. 16181040.3 dated Jan. 24, 2017.

*Primary Examiner* — Patricia T Nguyen
(74) *Attorney, Agent, or Firm* — Tarolli, Sundheim, Covell & Tummino LLP

(57) ABSTRACT

The invention describes a broadband matching network for coupling to an output of an amplifying device for amplifiers with a nominal operating frequency between 1 MHz and 100 MHz. The broadband matching network comprises a planar transformer with a primary winding arranged on a primary side of the broadband matching network and a secondary winding arranged on a secondary side of the broadband matching network. The primary winding is arranged to be electrically connected to the output of the amplifying device. The broadband matching network is characterized by a center frequency and a bandwidth with a frequency range of at least +/−3%. A first parallel resonance frequency and a second parallel resonance frequency of the broadband matching circuit are arranged around the series resonance frequency such that a frequency dependence of a load impedance provided by the broadband matching network for the amplifying device is reduced.

15 Claims, 7 Drawing Sheets

(56) References Cited

U.S. PATENT DOCUMENTS

| | | | |
|---|---|---|---|
| 9,748,864 B2* | 8/2017 | Luu | H02M 7/5387 |
| 2005/0104679 A1* | 5/2005 | Blednov | H01L 23/5222 |
| | | | 333/32 |
| 2006/0232342 A1 | 10/2006 | Floyd | |
| 2011/0273236 A1* | 11/2011 | Heijden | H03F 1/0294 |
| | | | 330/295 |
| 2013/0127257 A1* | 5/2013 | Yamamoto | H02J 5/005 |
| | | | 307/104 |
| 2013/0222075 A1* | 8/2013 | Reedy | H03J 3/20 |
| | | | 333/32 |
| 2014/0240063 A1 | 8/2014 | Leuschner | |
| 2015/0341059 A1* | 11/2015 | Hellberg | H03F 1/565 |
| | | | 455/120 |
| 2016/0065149 A1* | 3/2016 | Shaw | H03F 3/45179 |
| | | | 330/261 |
| 2019/0199298 A1* | 6/2019 | Takenaka | H03F 1/565 |

* cited by examiner

US 10,469,038 B2

BROADBAND MATCHING NETWORK

RELATED APPLICATIONS

The present invention claims priority of EP 16181040.3, filed on 25 Jul. 2016, the entirety of which is incorporated herein by reference.

FIELD OF THE INVENTION

The invention relates to a broadband matching network for an amplifying device, an amplifier arrangement comprising such a broadband matching network, an electrical generator comprising such an amplifier arrangement and a plasma processing system comprising such an electrical generator. The invention further relates to a method of implementing a broadband matching network for an amplifier arrangement.

BACKGROUND OF THE INVENTION

Matching networks are used in order to transform the impedance provided by the load of an amplifier, e.g. a plasma processing system, to a proper load impedance at a reference plane of the amplifying device, e.g. a transistor. Especially matching networks which can be integrated on a printed circuit board (PCB) are interesting in order to enable cost-effective construction and beneficial form factors. For the implementation of such matching networks at operation frequencies below 100 MHz planar transformers are very important. The matching bandwidth of such planar matching networks is usually low. The efficiency and output power of the combination of the amplifying device and the matching network therefore strongly depends on the impedance deviation with respect to the intended operation frequency.

SUMMARY OF THE INVENTION

It is an object of the present invention to provide a broadband matching network comprising a planar transformer with improved matching bandwidth. The invention is defined by the independent claims. The dependent claims define advantageous embodiments.

According to a first aspect a broadband matching network for coupling or connecting to an output of an amplifying device for an amplifier arrangement with a nominal operating frequency between 1 MHz and 100 MHz, more preferably between 5 MHz and 85 MHz and an output power of at least 100 W, more preferably at least 200 W and most preferably at least 250 W, is provided. The broadband matching network comprises a planar transformer with a primary winding arranged on a primary side of the broadband matching network and a secondary winding arranged on a secondary side of the broadband matching network. The primary winding is arranged to be electrically connected to the output of the amplifying device. The broadband matching network is characterized by a center frequency and a bandwidth with a frequency range of at least +/−3%, preferably at least +/−5%, more preferably at least +/−7% around the center frequency. The center frequency corresponds to the nominal operating frequency of the amplifier arrangement. The broadband matching network is arranged such that a series resonance frequency of the broadband matching network corresponds to the center frequency and a first parallel resonance frequency and a second parallel resonance frequency are arranged around the series resonance frequency such that a frequency dependence of a load impedance provided by the broadband matching network for the amplifying device is reduced.

A series resonance frequency is a resonance frequency of a circuit which can be described by an equivalent circuit diagram of a series resonant circuit in a frequency range around the series resonance frequency. The series resonance circuit consists of a capacitance and inductance in series. The impedance of such a circuit at and around resonant frequency is low.

A parallel resonance frequency is a resonance frequency of a circuit which can be described by an equivalent circuit diagram of a parallel resonant circuit in a frequency range around the parallel resonance frequency. The parallel resonance circuit consists of a capacitance and inductance in parallel. The impedance of such a circuit at and around resonant frequency is high.

Reducing frequency dependence of the load impedance provided to an amplifying device by means of the broadband matching network is especially useful if the amplifying device is used within an amplifier arrangement to provide power to a time varying or dynamic and especially a time varying external load as, for example, a plasma in a plasma chamber. The operating frequency may be tuned within the frequency band enabling an improved power transmission between the amplifying device and the time varying external load.

Furthermore, the matching circuit may have the advantage that the operating frequency of an electrical RF generator comprising an amplifier arrangement with the matching circuit may be enabled to be driven at a frequency different than the nominal operating frequency. The broadband matching network may therefore enable to adapt the operating frequency of the amplifier arrangement without substantial degradation of output power and efficiency which may be caused by a strong frequency dependence of the load impedance at the reference plane of an amplifying device.

The center frequency may preferably be the same as the nominal operating frequency. Anyhow, tolerances of the values of components may cause variations of the center frequency. The center frequency thus correspond to the nominal operating frequency of the amplifier arrangement such that the center frequency preferably deviates less than 2% from the nominal operating frequency, more preferably less than 1%) from the nominal operating frequency and is most preferably essentially the same as the nominal operating frequency.

The series resonance frequency of the broadband matching network corresponds to the center frequency of the broadband matching network such that the series resonance frequency preferably deviates less than 2% from the center frequency, more preferably less than 1%) from the center frequency and is most preferably essentially the same as the center frequency.

The first parallel resonance frequency is arranged at a lower frequency than the series resonance frequency, and the second parallel resonance frequency is arranged at a higher frequency than the series resonance frequency. The parallel resonance frequencies may be arranged out of the bandwidth of the broadband matching network or one or even both of the parallel resonance frequencies may be arranged inside of the bandwidth of the broadband matching network.

The planar transformer may, for example, be arranged such that a leakage inductance of the planar transformer in combination with shunt capacitors at the primary side and the secondary side of the planar transformer defines the position of the series resonance frequency, wherein the shunt capacitors in combination with the total primary and secondary inductances essentially define the positions of the first and the second parallel resonance.

The broadband matching network may comprise more than one series resonance frequency and more than two parallel resonance frequencies in order to improve matching between the amplifying device and the external load. The circuit may be adapted in this case by providing additional components (e.g. inductor(s), capacitor(s)) such that there are additional series and/or parallel resonances with corresponding resonance frequencies. In general it is important that there is at least one series resonance within the bandwidth and at least two parallel resonances. One parallel resonance is at a higher parallel resonance frequency than the series resonance frequency of the series resonance and one at a lower parallel resonance frequency than the series resonance frequency of the series resonance. Further resonance frequencies especially parallel resonance frequencies may be provided at even higher or lower frequencies.

The series resonance frequency, the first parallel resonance frequency and the second parallel resonance frequency are preferably arranged around the center frequency such that a magnitude of the load impedance varies within the bandwidth less than ±15%, preferably less than ±10% with respect to a mid-range magnitude value.

The mid-range magnitude value is defined as half of the sum of the maximum magnitude value and the minimum magnitude value within the bandwidth.

The series resonance frequency, the first parallel resonance frequency and the second parallel resonance frequency are preferably arranged around the center frequency such that a phase of the load impedance varies within the bandwidth less than ±10°, preferably less than ±7° with respect to a mid-range phase value The mid-range phase value is defined as half of the sum of the maximum phase value and the minimum phase value within the bandwidth.

Limitation of variations of the magnitude and especially the phase of the load impedance within the bandwidth of the broadband matching network as defined above reduces the frequency dependency of the output power and efficiency of the amplifying device.

The magnitude of the load impedance is preferably a convex function within a predefined frequency range around the center frequency, wherein the predefined frequency range is arranged within the bandwidth.

The magnitude of the load impedance is more preferably a convex function within a major part of the frequency range defined by the bandwidth of the broadband matching network. The magnitude of the load impedance is most preferably a convex function within the bandwidth of the broadband matching network.

The broadband matching network comprises preferably at least one serial inductor arranged on the primary side or the secondary side. The broadband matching network further comprises at least one shunt capacitance for providing the series resonance frequency, the first parallel resonance frequency and the second parallel resonance frequency.

Parasitic capacitance may be used such that one discrete shunt capacitance or capacitor may be sufficient.

Providing a separate serial inductor either on the primary side or the secondary side may increase freedom of design to provide the series resonance frequency and the parallel resonance frequencies in order to improve matching of amplifying device and external load as described above.

The serial inductor may preferably be configured as planar inductor which may optionally be manufactured on the same printed circuit board as the planar transformer. Combination of the planar serial inductor and the planar transformer may enable a very compact and cost-effective broadband matching circuit. The at least one shunt capacitance comprises preferably a first separate capacitance on the primary side and a second separate capacitance on the secondary side of the planar transformer. The first and the second capacitances may be used to provide a resonant tank. Alternatively or in addition, parasitic capacitance of an amplifying device (Cds, Cce) may, for example, be used as the primary shunt capacitance.

One, two or more capacitors may be used in parallel either on the primary or secondary side in order to limit the current across the shunt capacitors.

The broadband matching network comprises preferably at least one serial inductor which is arranged on the secondary side. At least one shunt capacitance is arranged on the primary side and additionally on the secondary side of the broadband matching network.

The at least one serial inductor may alternatively be arranged on the primary side. At least one separate shunt capacitance is also in this case arranged on the primary side and on the secondary side of the broadband matching network.

The separate series inductance may be either placed on the primary side or the secondary side of the planar transformer. Using only one separate series inductance may decrease the size of the broadband matching network especially if a planar inductor is used. The leakage inductance of the planar transformer may in this case be used on the side without separate series inductance or may be used to decrease the size of a planar inductor.

Positioning of the separate series inductance depends on the design of the planar transformer. The side of the planar transformer with lower impedance needs a smaller series inductance which has to be adapted to higher currents in comparison to the side of the transformer with higher impedance.

The amplifying device may, for example, be a push-pull pair of transistors. The series inductance has to be symmetrical on the primary side in this case (same inductance for each transistor) in order to provide the same common mode impedances for both transistors. The amplifying device may in this case be supplied with DC power by means of a center tapping of the primary winding resulting in a DC current flowing through the serial inductors on the primary side. One or more serial inductances on the primary side would in this case, only be beneficial if the serial inductance or inductances are very small in order to limit losses. The serial inductance or inductances may in this case preferably be arranged on the secondary side in order to enable an efficient amplifying arrangement comprising the amplifying device within the bandwidth of the broadband matching network.

The broadband matching network may alternatively comprise at least one serial inductor which comprises at least one first separate serial inductor arranged on the primary side and at least one second separate serial inductor arranged on the secondary side. The at least one shunt capacitance comprises at least one first shunt capacitor arranged on the primary side and at least one second shunt capacitor arranged on the secondary side.

A symmetric approach of, for example, one shunt capacitor and one serial inductor on the primary side and one shunt capacitor and one serial inductor on the secondary side may have the advantage that there is an additional degree of freedom to adapt the broadband matching network to the desired properties. A disadvantage of the symmetric approach may be that the broadband matching network may be larger in comparison to the asymmetric approach with only one separate serial inductor on either the primary or the secondary side.

Irrespective which approach is used, it may be necessary to take into account the leakage inductance of the transformer on the primary and the secondary side and parasitic capacitance of the amplifying device on the primary side in order to provide the desired frequency dependence of the broadband matching network.

According to a second aspect an amplifier arrangement is provided. The amplifier arrangement comprises an amplifying device. The amplifier arrangement is characterized by a nominal operating frequency between 1 MHz and 100 MHz, more preferably between 5 MHz and 85 MHz and an output power of at least 100 W, more preferably at least 200 W and most preferably at least 250 W. The amplifier arrangement further comprises a broadband matching network according to any one of the embodiments described above.

The combination of the amplifying device and the broadband matching circuit may enable an improved amplifier arrangement which can be used to improve power transfer especially in case of connection to a time varying or dynamic external load as described above. The amplifying device may preferably be a push-pull amplifier as described above and below.

According to a third aspect, an electrical generator for supplying electrical radio frequency (RF) power to a load, especially plasma, is provided. The electrical RF generator comprises an amplifier arrangement as described above.

The electrical RF generator comprises a control circuit, and a RF power amplifier. The control circuit comprises at least one processing device, at least one memory device, at least one power measurement device and at least one frequency generator. The control circuit is adapted to drive the RF power amplifier in a pulsed mode or a continuous mode.

According to a fourth aspect of the invention, a plasma processing system is provided. The plasma processing system comprises the electrical RF generator described above and a plasma chamber. The plasma is generated in the plasma chamber which comprises supply devices for providing the chemical components, such as processing gases, and the physical boundary conditions to enable a stable plasma process.

According to a fifth aspect, a method of implementing a broadband matching network for an amplifier arrangement with a nominal operating frequency between 1 MHz and 100 MHz, more preferably between 5 MHz and 85 MHz and an output power of at least 100 W, more preferably at least 200 W and most preferably at least 250 W is provided. The method comprises the steps of:

connecting a load to an output of an amplifying device comprised by the amplifier arrangement;
broadband transforming the load to a load impedance for the amplifying device by providing a series resonance frequency which corresponds to the nominal operating frequency and a first parallel resonance frequency and a second parallel resonance frequency, wherein the first parallel resonance frequency and the second parallel resonance frequency are arranged around the series resonance frequency such that a frequency dependence of the load impedance for the amplifying device is reduced within a frequency range of at least +/−3%, preferably at least +/−5%, more preferably at least +/−7% around the center frequency.

It shall be understood that the method of claim 15 and the broadband matching network of claim 1 have similar and/or identical embodiments, in particular, as defined in the dependent claims.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from, and elucidated with reference to the embodiments described hereinafter.

The invention will now be described, by way of example, based on embodiments with reference to the accompanying drawings.

In the drawings:

FIG. 1 shows a schematic drawing of a first broadband matching network

Figure 2:
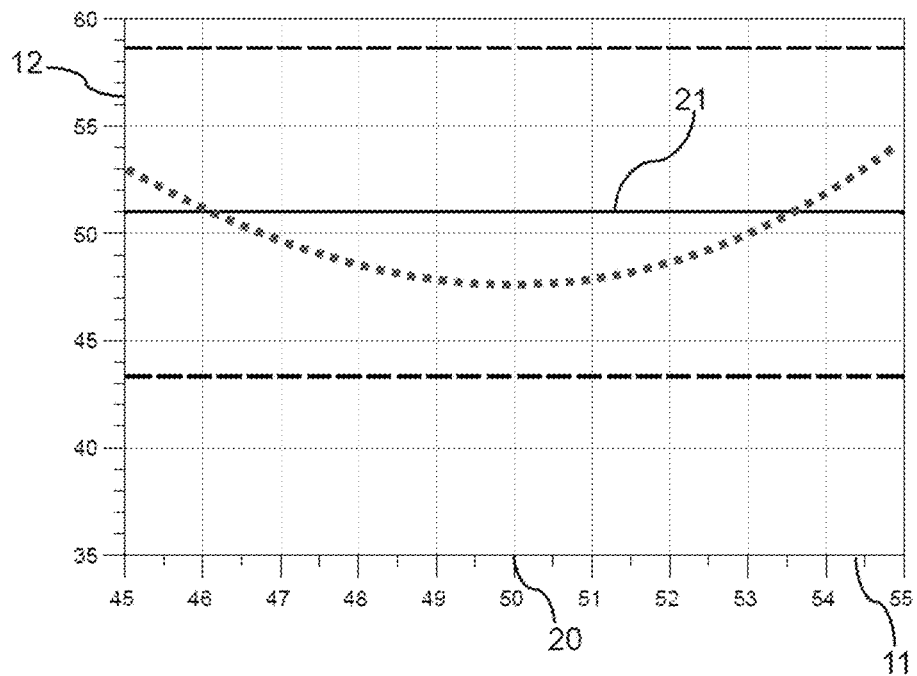
Figure 3:
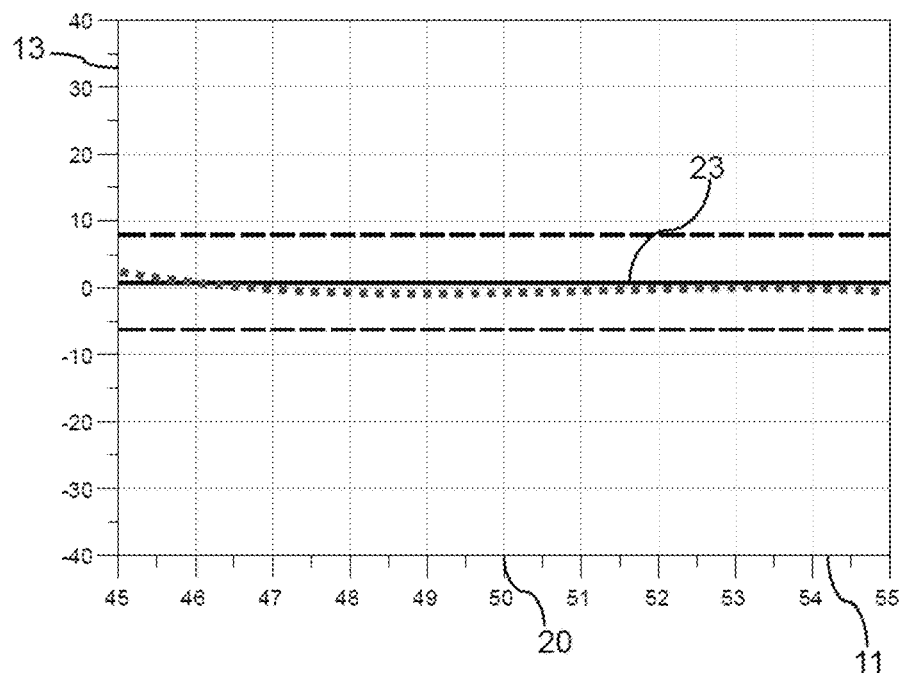
Figure 4:
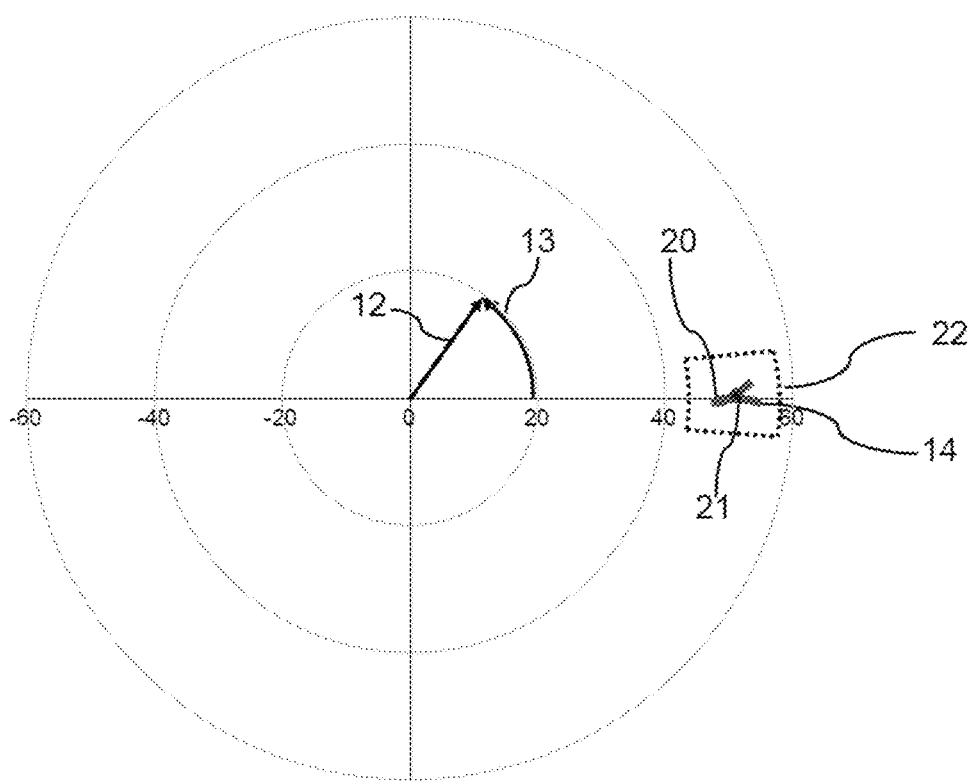
Figure 5:
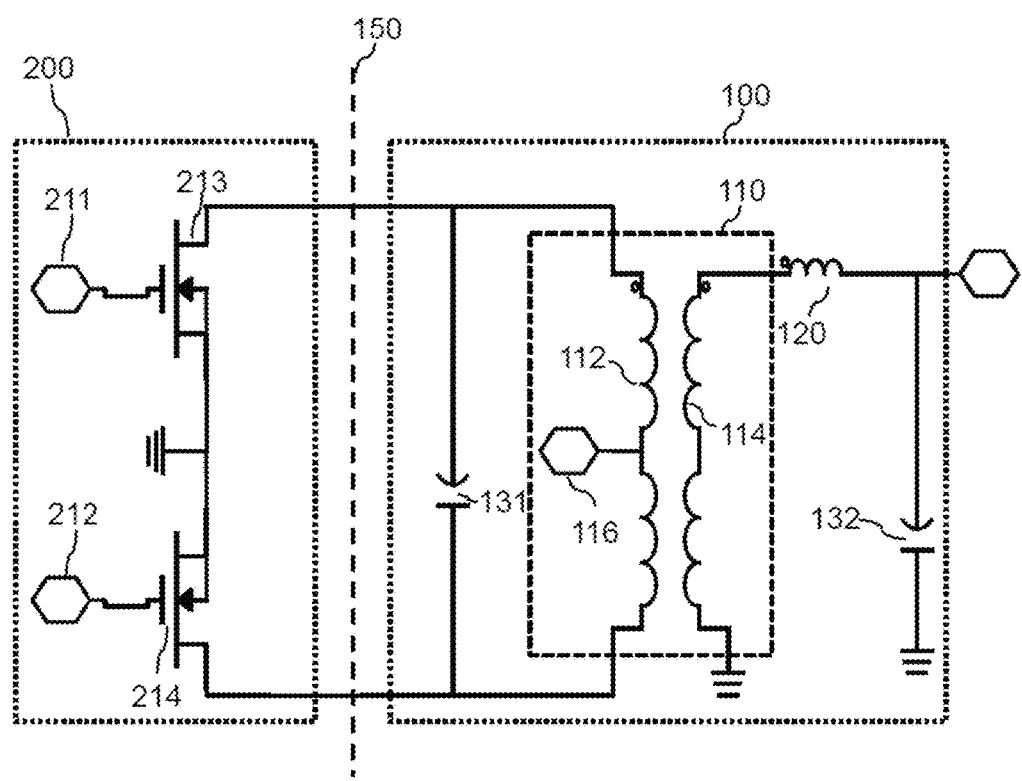
Figure 6:
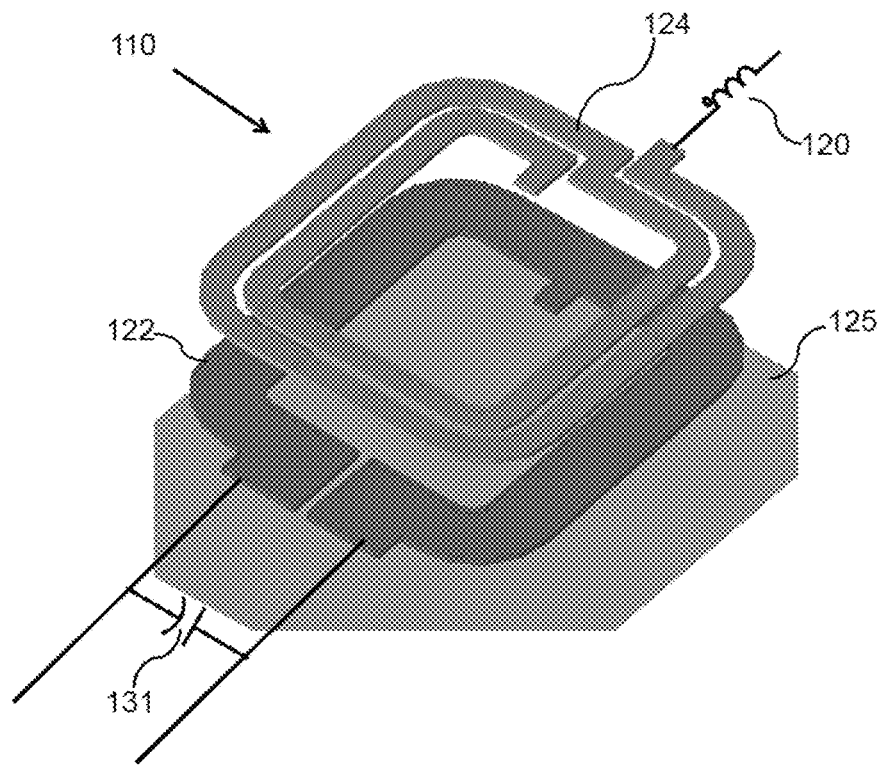
Figure 7:
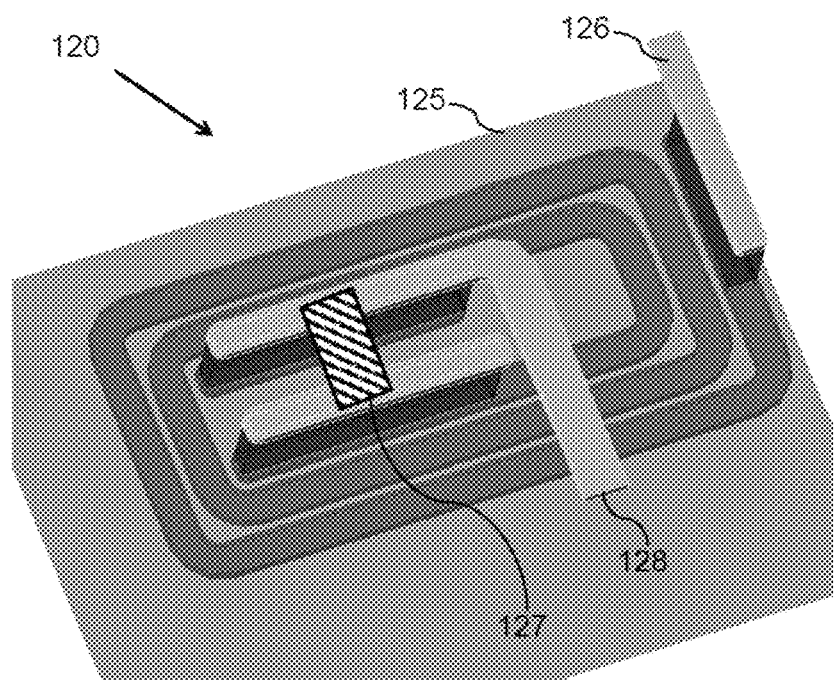
Figure 8:
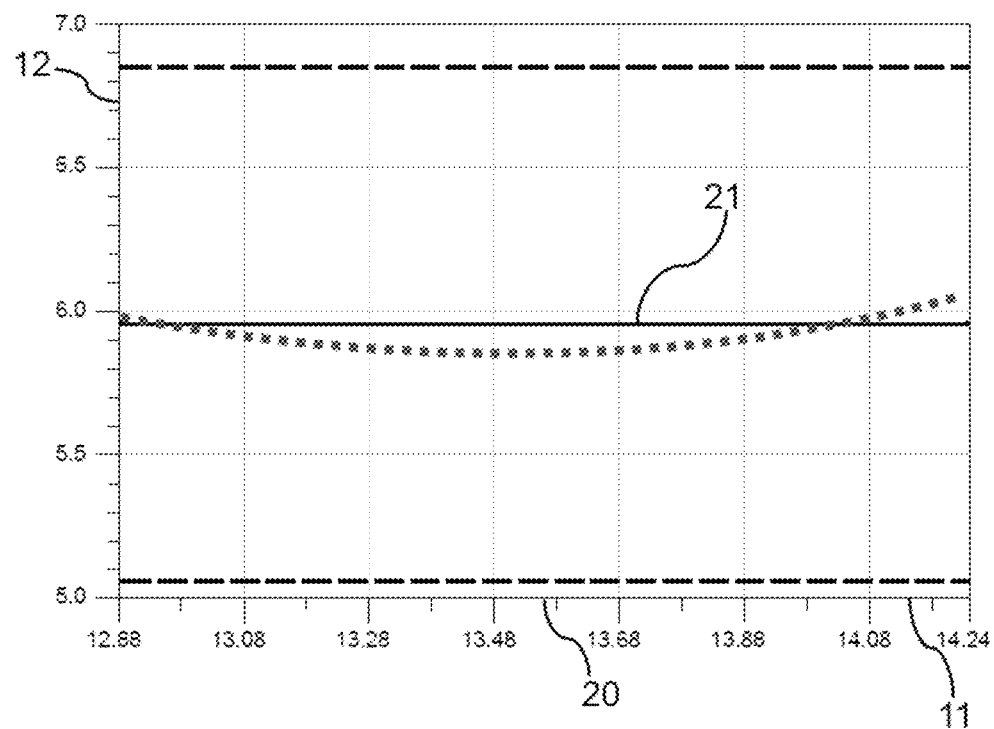
Figure 9:
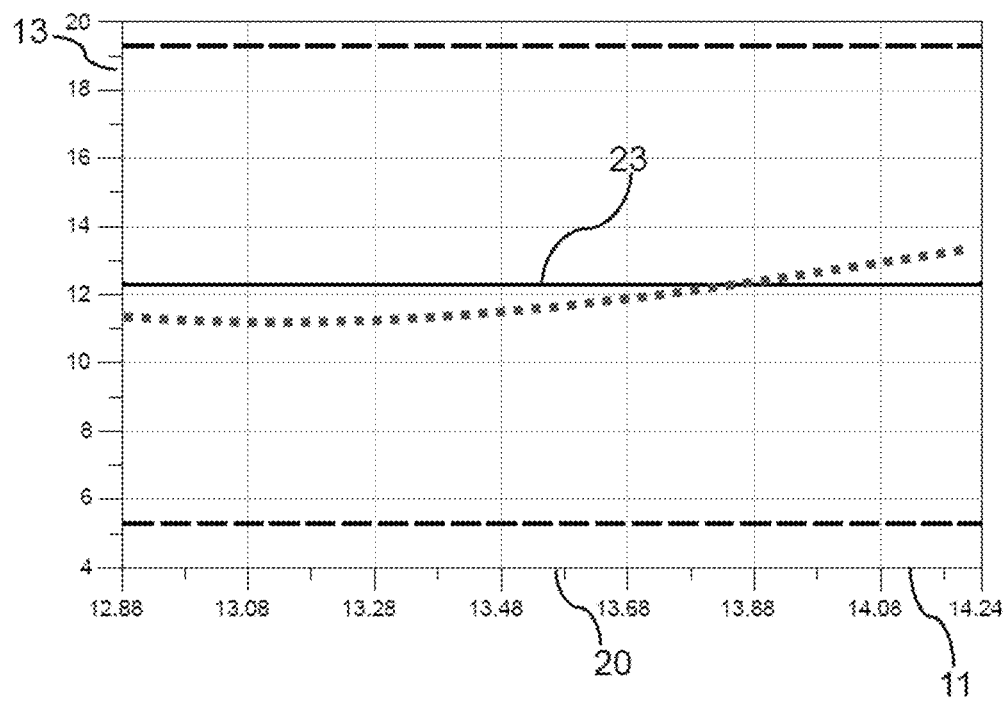
Figure 10:
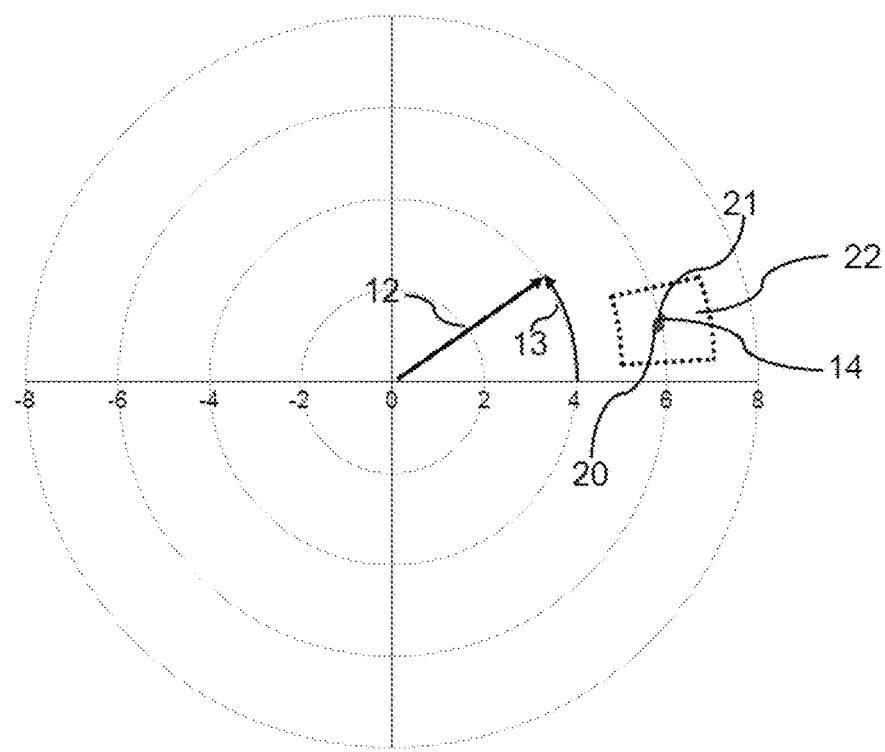
Figure 11:
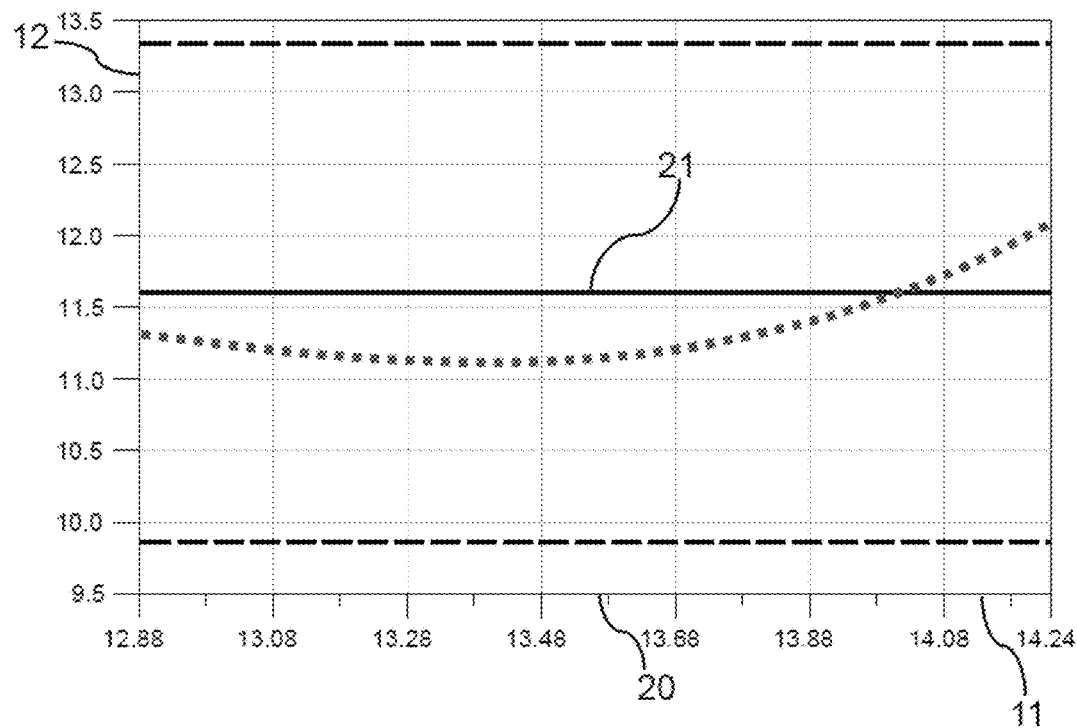
Figure 12:
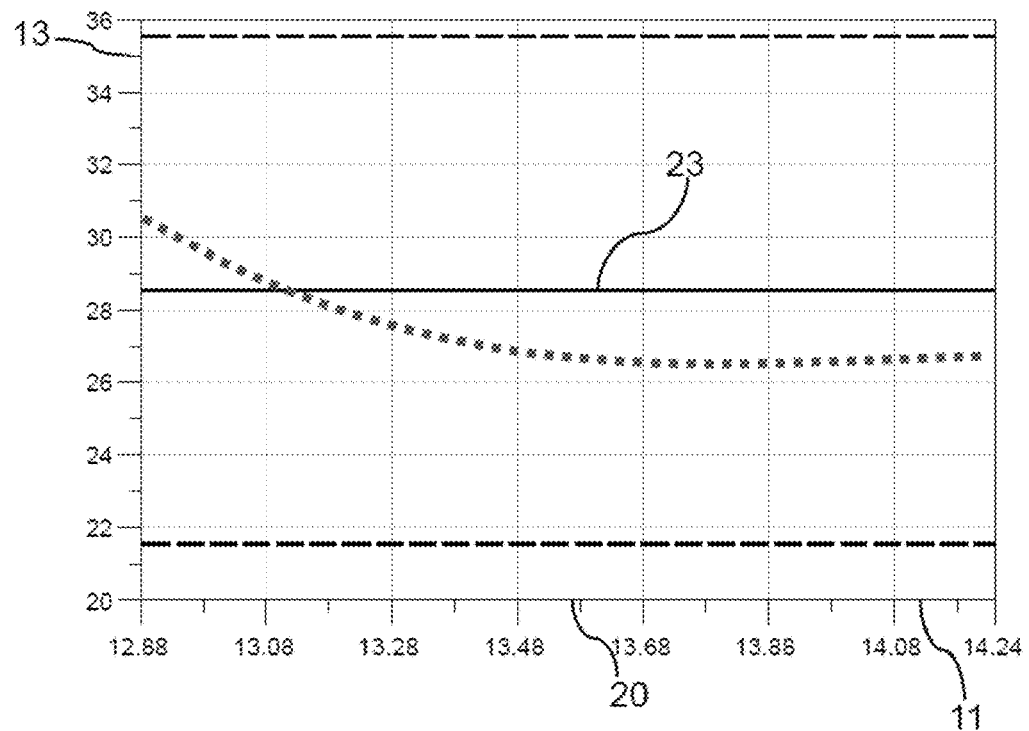
Figure 13:
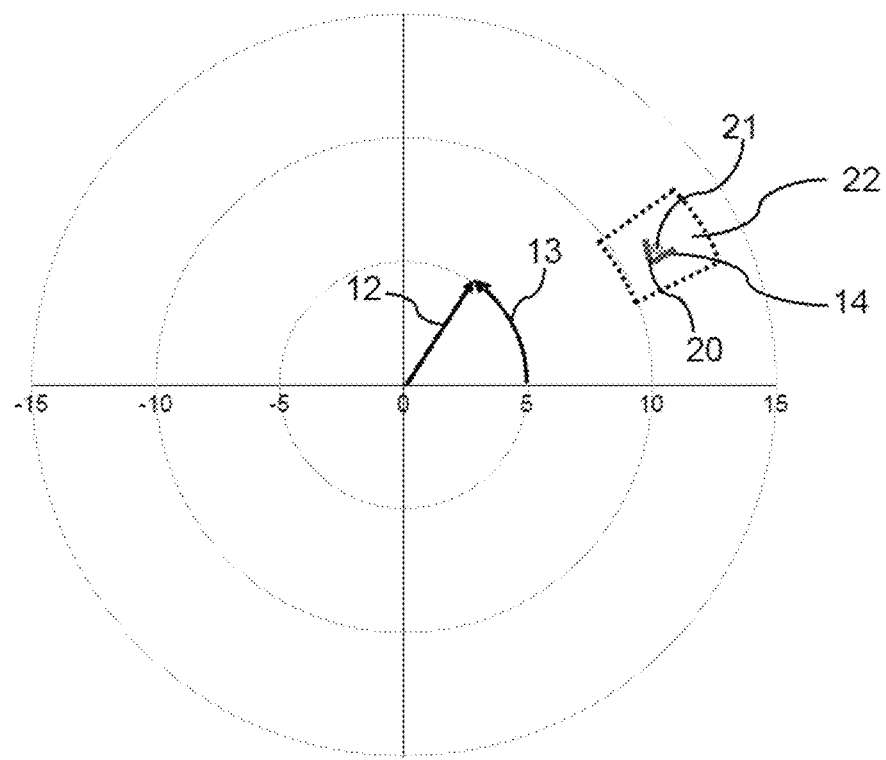

FIG. 2 shows the frequency dependence of the magnitude of the load impedance of the first broadband matching network FIG. 3 shows the frequency dependence of the phase of the load impedance of the first broadband matching network FIG. 4 shows the frequency dependence of the load impedance of the first broadband matching network in polar coordinates FIG. 5 shows a schematic drawing of a first amplifying arrangement with a second broadband matching network FIG. 6 shows a schematic drawing of a first planar transformer FIG. 7 shows a schematic drawing of a first planar inductor FIG. 8 shows the frequency dependence of the magnitude of the load impedance of the second broadband matching network FIG. 9 shows the frequency dependence of the phase of the load impedance of the second broadband matching network FIG. 10 shows the frequency dependence of the load impedance of the second broadband matching network in polar coordinates FIG. 11 shows the frequency dependence of the magnitude of the load impedance of a third broadband matching network FIG. 12 shows the frequency dependence of the phase of the load impedance of the third broadband matching network FIG. 13 shows the frequency dependence of the load impedance of the third broadband matching network in polar coordinates In the Figures, like numbers refer to like objects throughout. Objects in the Figures are not necessarily drawn to scale. In the figures, unless explicitly stated otherwise, frequencies are expressed in MHz, magnitudes of impedances in Ohm, and phases of impedances in degrees of angle.

DETAILED DESCRIPTION OF EMBODIMENTS

Various embodiments of the invention will now be described by means of the Figures.

Figure 1:
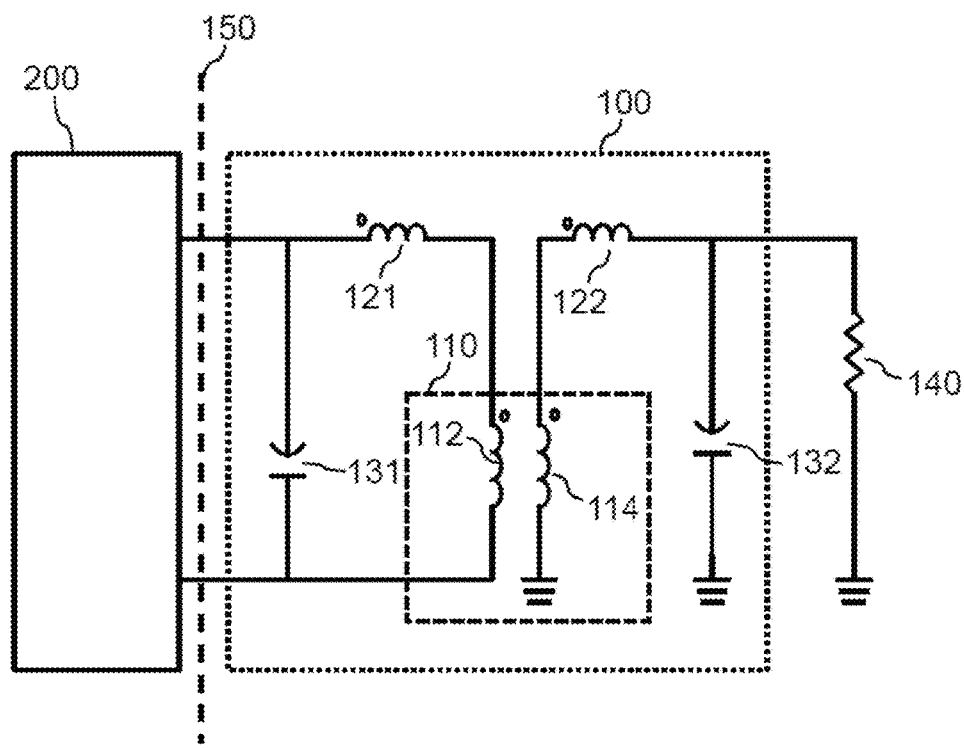

FIG. 1 shows a schematic drawing of a first broadband matching network 100 in combination with a schematic drawing of an amplifying device 200 connected at a reference plane 150 to an input of the broadband matching network 100 and an external load 140 which is connected to an output of the broadband matching network 100. The broadband matching network 100 comprises in this symmetric embodiment a first shunt capacitance 131 and a first serial inductor 121 on the primary side of the planar transformer 110. The planar transformer 110 comprises a primary winding 112 on the primary side. The broadband matching network 100 further comprises a second shunt capacitor 132 and a second serial inductor 122 on the secondary side of the planar transformer 110. The planar transformer 110 further comprises a secondary winding 114 on the secondary side. The first broadband matching network 100 is characterized by a center frequency $f_C$=50 MHz and a bandwidth BW=50 MHz+/−10% (45-55 MHz). The inductance of the planar transformer is 50 nH, both shunt capacitors on the primary and the secondary side have a capacitance of 118 pF and the serial inductors have an inductance of 50 nH. The load impedance provided to the amplifying device 200 at the reference plane 150 is 50 Ohm as well as the impedance of the external load 140.

FIG. 2 shows the frequency dependence of the magnitude of the load impedance of the first broadband matching network 100. The magnitude of the load impedance 12 (ordinate) depends on the frequency 11 (abscissa). The magnitude of the load impedance of the broadband matching network 100 is within the bandwidth between 45 MHz and 55 MHz a convex function with a minimum at the center frequency 20 of the bandwidth at 50 MHz which is in this case the same as the nominal operating frequency of an amplifier arrangement (not shown) comprising the amplifying device 200. The operating frequency of the amplifier arrangement may in operation, for example, vary in a range of +/−5% around the nominal operating frequency. The magnitude of the load impedance varies within the bandwidth between around 54 Ohm and around 47 Ohm. The deviation of the intended magnitude of the load impedance of 50 Ohm is therefore less than 10%. The upper dashed line shows the upper acceptance limit which is 1.15 times the mid-range magnitude value 21 of the load impedance (51 Ohm in this case). The lower dashed line shows the lower acceptance limit which is 0.85 times the of the mid-range magnitude value load impedance.

FIG. 3 shows the frequency dependence of the phase of the load impedance of the first broadband matching network 100. The ordinate axis shows the phase of the load impedance 13 and the abscissa axis again the frequency 11. The upper dashed line shows the upper acceptance limit which is 8° (mid-range phase value 1° in this case). The lower dashed line shows the lower acceptance limit which is −6°. The phase of the load impedance is very stable and near to 0° across the whole bandwidth of the broadband matching network.

FIG. 4 shows the frequency dependence of the load impedance of the first broadband matching network 100 in polar coordinates. The radial distance from the origin shows the magnitude of the load impedance 12. The phase of the load impedance 13 is counted counter clock wise as indicated by the arrow. The intended range of load impedances 22 is surrounded by a dotted line. The area surrounded by the dotted line should be a schematic of a ring segment. The outer radial line represents in this case the maximum magnitude value and the inner radial line the minimum magnitude value. The mid-range magnitude value 21 is indicated by a dot. The load impedance is well within the intended range 22.

Prior art approaches often show that it is possible to provide a relative stable magnitude of the load impedance but the phase of the load impedance usually changes very abruptly within the frequency range of +/−10% or even +/−5% around the center frequency 20. In the prior art approaches, the load impedance therefore quickly leaves the intended range 22 due to the changing phase of the load impedance.

FIG. 5 shows a schematic drawing of a first amplifying arrangement with a second broadband matching network 100. The schematic drawing shows an equivalent circuit diagram of a prototype amplifying arrangement comprising an amplifying device 200 which has been realized for providing power to a time varying external load (plasma in a plasma chamber) at a frequency of 13.56 MHz. The amplifying device 200 is in this case a double transistor (MOSFET) in push-pull arrangement with two transistors 213, 214 with balanced input at the gates and a connection to ground for the sources of both transistors 213, 214. A gate of the first transistor 213 is connected to a 0° input 211. A gate of the second transistor 214 is connected to a 180° input 212. A drain of the first transistor 213 is connected to the broadband matching network 100. A drain of the second transistor 214 is also connected to the broadband matching network 100.

Such a push-pull topology is beneficial for a high power HF-amplifier. The optimum load impedance of the push-pull power transistors 213, 214 is in comparison to a parallel arrangement of transistors 213, 214 four times higher. The push-pull topology therefore enables an easier matching of the load to the amplifying device. In addition the push-pull topology is well-suited to enable defined termination of harmonic frequencies. Push-pull operation and the transformer based matching network enables, for example, open-circuit termination of the even harmonics. Odd harmonics can be terminated with low impedance. By means of these technical measures the transistors 213, 214 can be operated with high efficiency in the so-called "Inverse class F" operation mode. Terminating all even harmonics with infinite and all odd harmonics except of the fundamental one with zero impedance would result in an ideal case in a truncated sinusoidal drain voltage waveform with a rectangular drain current. The theoretical efficiency is equal to 100%. In reality an efficiency of more than 80% is possible. The broadband matching circuit 100 enables a DC-to-RF efficiency of greater than 75% for a realized amplifier arrangement within the bandwidth of the broadband matching network.

The broadband matching network 100 shown in FIG. 5 comprises a planar transformer which enables low impedance matching by providing a ratio of the primary winding to the secondary winding of 1:2. The size of the planar transformer 110 is 56×65 mm. The first shunt capacitor 131 on the primary side has a capacitance of 3 nF.

The second shunt capacitor 132 on the secondary side has a capacitance of 0.35 nF. The planar printed circuit board serial inductor 120 with three turns has an inductance of 235 nH. The size of the planar serial inductor 120 is 56×27 mm.

FIG. 6 shows a schematic drawing of a first planar transformer 110 which is similar or identical with the one used in the amplifier arrangement shown in FIG. 5. The first planar transformer 110 comprises a multilayer printed circuit board (PCB). Some of the intermediate layers have been omitted for clarity reasons. The primary winding 122 with one turn is arranged below the secondary winding 124 with two turns. An intermediate isolating layer between the primary winding 122 and a secondary winding 124 is not shown. Both terminals of the primary winding 122 are connected via the first shunt capacitor 131. The output of the secondary winding 124 is connected to serial inductor 120.

Details of the further connections are shown in the equivalent circuit diagram shown in FIG. 5.

FIG. 7 shows a schematic drawing of a first planar serial inductor 120. The first planar serial inductor 120 comprises a PCB 125 similar or identical to the one described in FIG. 6. A coil with three turns is manufactured on the surface of an isolating layer and comprises a connection to the load 126 and a connection to secondary winding of the planar transformer 128. A fine-tuning of the impedance of serial inductor 120 may be performed by means of jumper 127.

FIG. 8 shows the frequency dependence of the magnitude of the load impedance of the second broadband matching network 100 shown in FIG. 5. The presentation of the magnitude of the load impedance is the same as discussed with respect to FIG. 2 above. The center frequency is $f_C$=13.56 MHz and the bandwidth is BW=13.56 MHz +/−5%. The magnitude of the load impedance is nearly constant 6 Ohm within the bandwidth. The magnitude of the load impedance is again a convex function within the bandwidth with a minimum near the center frequency.

FIG. 9 shows the frequency dependence of the phase of the load impedance of the second broadband matching network shown in FIG. 5. The presentation of the phase of the load impedance is the same as discussed with respect to FIG. 3 above. The phase of the load impedance varies only between 11° and 14° and is well within the boundaries of ±7° indicated by the dashed lines.

FIG. 10 shows the frequency dependence of the load impedance of the second broadband matching network 100 shown in FIG. 5 in polar coordinates. The presentation of the load impedance is the same as discussed with respect to FIG. 4 above. The impedance is nearly constant within the bandwidth and thus within the intended impedance range 22.

FIG. 11 shows the frequency dependence of the magnitude of the load impedance of a third broadband matching network 100.

The third broadband matching network 100 has been tested within an amplifier arrangement together with a push-pull amplifier. The equivalent circuit diagram of the amplifier arrangement is similar as shown above in FIG. 5. The third broadband matching network 100 comprises in this case a planar transformer which enables higher impedance at reference plane 150 than the second matching arrangement by providing a ratio of the primary winding to the secondary winding of 1:1. The size of the planar transformer 110 is 56×65 mm with a two layer PCB. The first shunt capacitor 131 on the primary side has a capacitance of 2.6 nF. The second shunt capacitor 132 on the secondary side has a capacitance of 0.6 nF. The planar printed circuit board serial inductor 120 with three turns has an inductance of 190 nH. The size of the planar serial inductor 120 is 56×27 mm.

The presentation of the magnitude of the load impedance is the same as discussed with respect to FIG. 2 above. The center frequency is $f_C$=13.56 MHz and the bandwidth is BW=13.56 MHz +/−5%. The magnitude of the load impedance varies between 11 Ohm and around 12 Ohm within the bandwidth. The magnitude of the load impedance is again a convex function within the bandwidth with a minimum of 11.1 Ohm at 13.33 MHz.

FIG. 12 shows the frequency dependence of the phase of the load impedance of the third broadband matching network 100. The presentation of the phase of the load impedance is the same as discussed with respect to FIG. 3 above. The phase of the load impedance varies only between 31° and 26 ° and is well within the boundaries of ±7° indicated by the dashed lines.

FIG. 13 shows the frequency dependence of the load impedance of the third broadband matching network 100 in polar coordinates. The presentation of the load impedance is the same as discussed with respect to FIG. 4 above. The impedance varies only slightly around the impedance at the center frequency and is well within the intended impedance range 22.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of, or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 11 frequency
12 magnitude of load impedance
13 phase of load impedance
14 load impedance in polar coordinates
20 center frequency
21 mid-range magnitude value
22 intended impedance range
23 mid-range phase value
100 broadband matching network
110 planar transformer
112 primary winding
114 secondary winding
116 central tapping
120 serial inductor
121 first serial inductor
122 second serial inductor
125 printed circuit board (PCB)
126 connection to the load
127 jumper
128 connection to secondary winding of the planar transformer
131 first shunt capacitor
132 second shunt capacitor
140 load
150 reference plane
200 amplifying device
211 input 0°
212 input 180°
213 first transistor
214 second transistor

The invention claimed is:

1. A broadband matching network for coupling to an output of an amplifying device for an amplifier arrangement with a nominal operating frequency between 1 MHz and 100 MHz, more preferably between 5 MHz and 85 MHz and an output power of at least 100 W, more preferably at least 200 W and most preferably at least 250 W, wherein the broadband matching network comprises a planar transformer with a primary winding arranged on a primary side of the broadband matching network and a secondary winding arranged on a secondary side of the broadband matching network, wherein the primary winding is arranged to be electrically connected to the output of the amplifying device, wherein the broadband matching network is characterized by a center frequency and a bandwidth with a frequency range of at least +/−3%, preferably at least +/−5%, more preferably at least +/−7% around the center frequency, wherein the center frequency corresponds to the nominal operating frequency, and wherein the broadband matching network is arranged such that a series resonance frequency of the broadband matching network corresponds to the center frequency, and a first parallel resonance frequency and a second parallel resonance frequency of the broadband matching network are arranged around the series resonance frequency such that a frequency dependence of a load impedance provided by the broadband matching network is reduced.

2. The broadband matching network according to claim 1, wherein the series resonance frequency, the first parallel resonance frequency and the second parallel resonance frequency are arranged around the center frequency such that a deviation of a magnitude of the load impedance varies within the bandwidth less than ±15%, preferably less than ±10% with respect to a mid-range magnitude value.

3. The broadband matching network according to claim 1, wherein the series resonance frequency, the first parallel resonance frequency and the second parallel resonance frequency are arranged around the center frequency such that a phase of the load impedance varies within the bandwidth less than ±10°, preferably less than ±7° with respect to a mid-range phase value.

4. The broadband matching network according to claim 2, wherein the magnitude of the load impedance is a convex function within a predefined frequency range, wherein the predefined frequency range is arranged within the bandwidth.

5. The broadband matching network according to claim 4, wherein the magnitude of the load impedance is a convex function within the bandwidth.

6. The broadband matching network according to claim 1, wherein the broadband matching network comprises at least one serial inductor arranged on the primary side or the secondary side, and wherein the broadband matching network comprises at least one shunt capacitance for providing the series resonance frequency, the first parallel resonance frequency and the second parallel resonance frequency.

7. The broadband matching network according to claim 6, wherein the at least one serial inductor is arranged on the secondary side, and wherein at least one shunt capacitance is arranged on the primary side and on the secondary side of the broadband matching network.

8. The broadband matching network according to claim 6, wherein the at least one serial inductor is arranged on the primary side, and wherein at least one shunt capacitance is arranged on the primary side and on the secondary side of the broadband matching network.

9. The broadband matching network according to claim 6, wherein the at least one serial inductor comprises at least one first serial inductor arranged on the primary side and at least one second serial inductor arranged on the secondary side, and wherein the at least one shunt capacitance comprises at least one first shunt capacitor arranged on the primary side and at least one second shunt capacitor arranged on the secondary side.

10. The broadband matching network according to claim 1, wherein the planar transformer is arranged to provide a leakage inductance, and wherein the broadband matching network comprises at least one shunt capacitance for providing in combination with the planar transformer the series resonance frequency, the first parallel resonance frequency and the second parallel resonance frequency.

11. An amplifier arrangement comprising an amplifying device, the amplifier arrangement being characterized by a nominal operating frequency between 1 MHz and 100 MHz, more preferably between 5 MHz and 85 MHz and an output power of at least 100 W, more preferably at least 200 W and most preferably at least 250 W, wherein the amplifier arrangement further comprises a broadband matching network according to claim 1 coupled to an output of the amplifying device(200).

12. The amplifier arrangement according to claim 11, wherein the amplifying device is a pair of transistors in push-pull arrangement.

13. An electrical generator for supplying electrical radio frequency power to a load, the electrical radio frequency generator comprising a radio frequency amplifier arrangement according to claim 11.

14. A plasma processing system comprising the electrical radio frequency generator according to claim 13 and a plasma chamber.

15. A method of implementing a broadband matching network for an amplifier arrangement with a nominal operating frequency between 1 MHz and 100 MHz, more preferably between 5 MHz and 85 MHz and an output power of at least 100 W, more preferably at least 200 W and most preferably at least 250 W, the method comprising the steps of:
  connecting a load to an output of an amplifying device comprised by the amplifier arrangement;
  broadband transforming the load to a load impedance for the amplifying device by providing a series resonance frequency which corresponds to the nominal operating frequency and a first parallel resonance frequency and a second parallel resonance frequency, wherein the first parallel resonance frequency and the second parallel resonance frequency are arranged around the series resonance frequency such that a frequency dependence of the load impedance for the amplifying device is reduced within a frequency range of at least +/−3%, preferably at least +/−5%, more preferably at least +/−7% around the center frequency.

* * * * *